United States Patent

[11] 3,596,188

[72] Inventor John A. Hasse
Bloomington, Minn.
[21] Appl. No. 881,905
[22] Filed Dec. 3, 1969
[45] Patented July 27, 1971
[73] Assignee Control Data Corporation
Minneapolis, Minn.

[54] FOUR-PHASE DIGITAL CLOCK
9 Claims, 2 Drawing Figs.

[52] U.S. Cl. .......... 328/62, 307/208, 307/215, 307/262, 307/269, 328/63, 328/155, 331/45, 331/143
[51] Int. Cl. .......... H03k 1/00, H03k 19/20
[50] Field of Search .......... 307/208, 215, 260, 261, 262, 269; 328/59, 60, 62, 63, 71, 72, 74, 75, 155, 156—158, 180; 331/45, 60, 61, 57, 74, 143

[56] References Cited
UNITED STATES PATENTS
3,418,498 12/1968 Farley .......... 307/208 X
3,448,295 6/1969 Wanlass .......... 307/262 X

*Primary Examiner*—Stanley D. Miller, Jr.
*Attorney*—Cushmann, Darby & Cushman

ABSTRACT: A four-phase digital clock for use in digital systems whereby an oscillator means simultaneously provides a first triangular waveshape output signal and a second substantially square waveshape output signal and a second substantially square waveshape output signal in a quadrature with respect to one another and including logic means coupled to the outputs of the oscillator means for providing the four-phase digital clock signal. The oscillator includes a Miller integrator connected in series with a high gain positive feedback amplifier the output of which is fed back to the input of the integrator. The four clock pulses are derived by sensing the positive-going high gain amplifier output, sensing the negative-going high gain amplifier output, sensing the zero crossing integrator output (positive-going), and sensing the zero crossing integrator output (negative-going).

INVENTOR

JOHN A. HAASE

BY Cushman, Darby & Cushman

ATTORNEYS

INVENTOR

JOHN A. HAASE

BY Cushman, Darby & Cushman
ATTORNEYS

FOUR-PHASE DIGITAL CLOCK

The present invention relates to a multiphase digital clock and more particularly to a four-phase astable clock circuit for use at a low frequency, e.g., less than about 10 kHz.

The general purpose of this invention is to provide a four-phase digital clock circuit. To attain this the present invention contemplates a unique arrangement of a Miller integrator together with a high gain positive feedback amplifier which acts as a saturating switch, as opposed to linear operation, and whereby the output of the positive feedback amplifier is coupled to an input of the Miller integrator. This arrangement provides an oscillator which simultaneously produces a first substantially triangular waveshape output signal from the Miller integrator and a second substantially square waveshape output signal from the high gain positive feedback amplifier in quadrature with respect to the triangular waveshape output signal. A logic arrangement is coupled to the outputs of the oscillator to provide a four-phase digital signal.

Accordingly, an object of the present invention is the provision of a simply constructed four-phase digital clock circuit whose phase outputs exhibit no overlap in time.

Another object is to provide a four-phase digital clock circuit which has a minimum of external parts, and achieves a high degree of standardization by using parts of similar construction.

A further object of the invention is the provision of a four-phase astable digital clock circuit which is extremely stable with respect to voltage and temperature variations.

Still another object is to provide a four-phase digital clock which is capable of being gated on and off.

Other objects and features of the invention will become apparent to those of ordinary skill in the art as the disclosure is made in the following description of a preferred embodiment of the invention as illustrated in the accompanying sheet of drawings in which.

Figure 1:
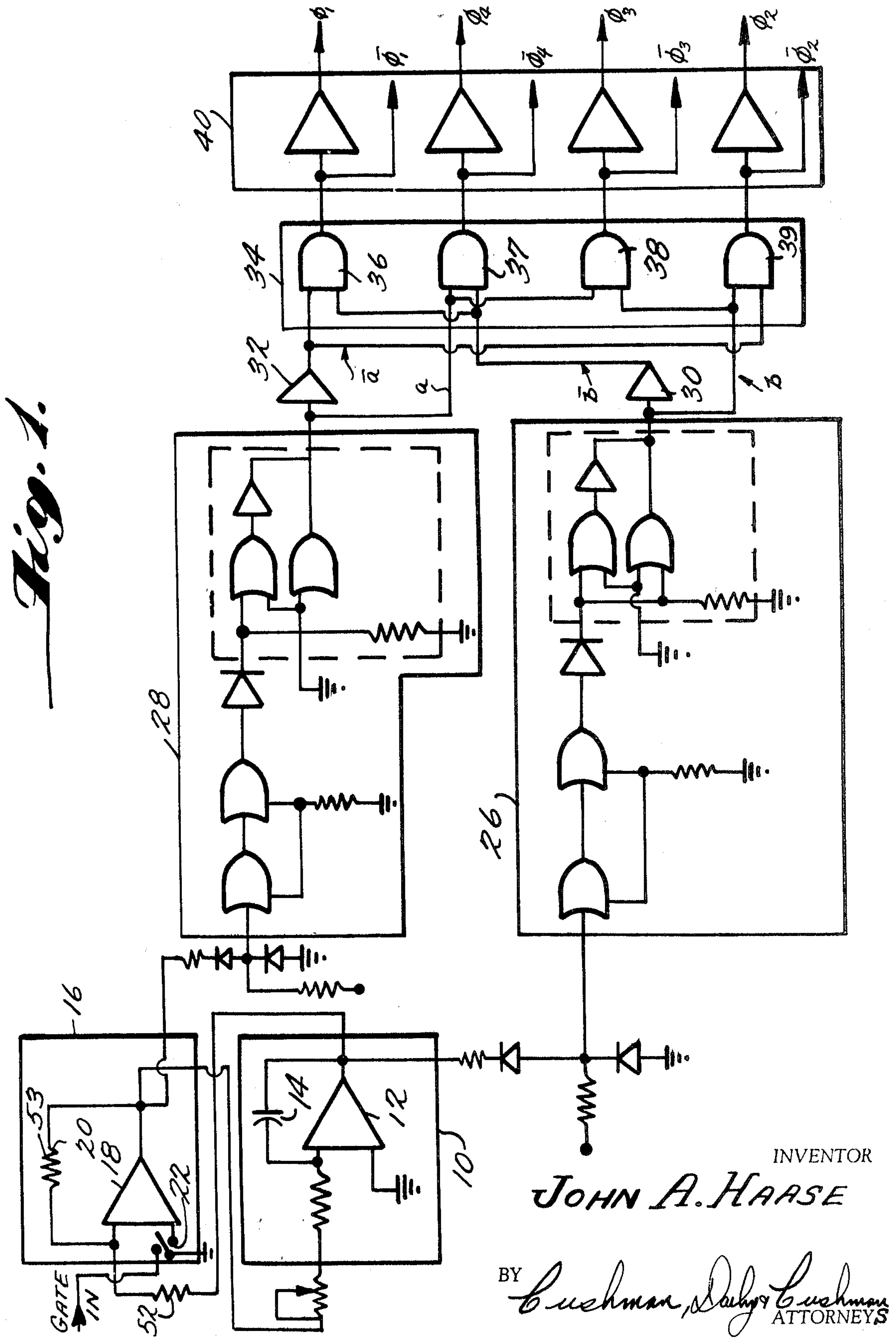
FIG. 1 shows a schematic view of a preferred embodiment of the invention.

With reference now to FIG. 1 there is shown first amplifier means or Miller integrator 10 which includes an operational amplifier 12 and a feedback capacitor 14 coupled between the output and an input of the operational amplifier. The output of Miller integrator 10 is coupled to an input of nonlinear or saturating switch means 16 which includes a high gain positive feedback amplifier comprised of operational amplifier 18 and feedback resistor 20. A switch 22 may be coupled to the other input of the operational amplifier 18 for selective connection with either ground or input line 24, which may be used for applying a gate signal to the operational amplifier 18 if desired.

The output of Miller integrator 10 is coupled via a resistor-diode circuit to a first comparator means 26. Similarly, the output from saturating switch means 16 is coupled via a resistor and diode circuit to the input of a second comparator means 28. Each of the first and second comparator means are preferably Schmitt trigger circuits and the components are illustrated in FIG. 1. In view of the fact that Schmitt trigger circuits are well known in the art the detailed operation and description of same is not included herein. The outputs of first and second comparator means 26 and 28 are respectively coupled to first and second inverter means 30 and 32. The outputs from these first and second inverter means are coupled to gate means 34 which includes a plurality of NAND gates 36, 37, 38 and 39. The outputs from comparator means 26 and 28 are also coupled to predetermined ones of the NAND gates and the outputs from the NAND gates 36—39 are coupled to third inverter means or inverting amplifiers 40, which provide the four-phase digital clock output.

Figure 2:
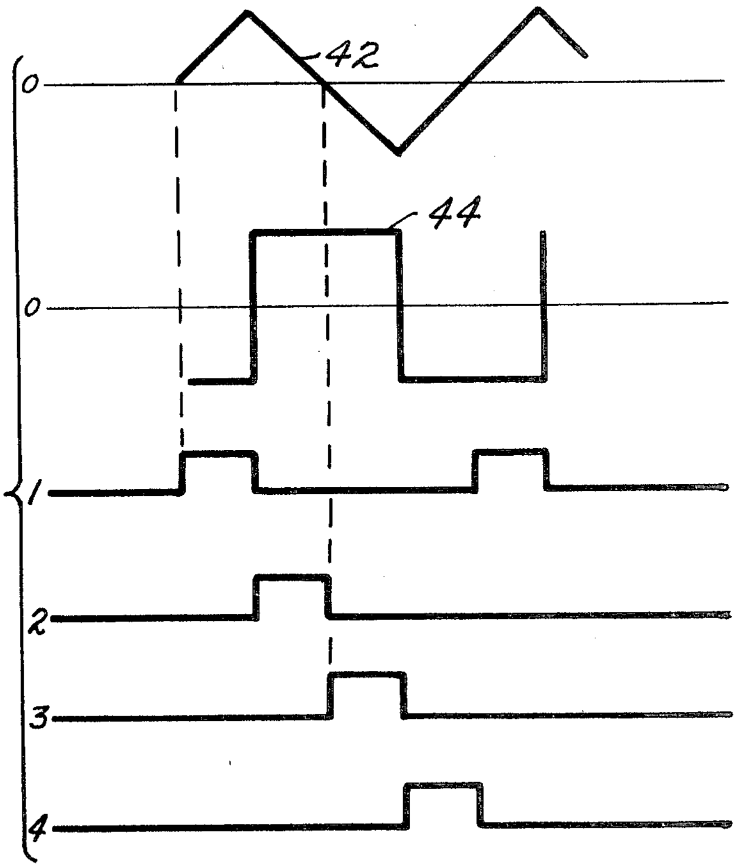
FIG. 2 is graphical representation of the signal waveform produced by the circuit of FIG. 1.

The Miller integrator 10 and the high gain positive feedback amplifier or saturating switch means 16 together form an oscillator. When the input to operational amplifier 18 that is connected to switch 22 is grounded, as illustrated in FIG. 1, the oscillator readily acts as a free running oscillator so that the Miller integrator 10 provides a substantially triangular waveshape output signal and the saturating switch means or positive feedback amplifier 16 provides a substantially square waveshape output signal whereby the output signals are in quadrature with respect to one another. These waveforms are illustrated in FIG. 2 wherein the triangular waveform is represented at 42 while the square waveform is represented at 44.

The triangular and square waveforms are alternately positive and negative and the times of zero crossing are determined by the amplitude comparators or Schmitt trigger circuits 26 and 28 which produce fast switching outputs and complements thereof through the inverters 30 and 32. The signals provided at the outputs of comparators 26 and 28 together with the signals provided at the outputs of inverters 30 and 32 are applied to gates 36—39, the outputs of which are then applied to the inverting amplifiers 40 to yield the clock phases $\Phi_1$ to $\Phi_4$ as illustrated in FIG. 2.

Where the signal output from comparator 26 is $b$, the signal output from inverter 30 is $\bar{b}$. The signal put-put from comparator 28 is $a$ and the signal from the output of inverter 32 is $\bar{a}$. The logic equations with respect to these signals and the clock pulses are as follows:

$$\Phi_1=\bar{a}\,\bar{b};\ \Phi_2=\bar{a}\,b;\ \Phi_3=a\,b;\ \text{and}\ \Phi_4=a\,\bar{b}.$$

Because the signals $a$ and $b$ do not change simultaneously the phase outputs $\Phi_1$—$\Phi_4$ do not overlap in time or suffer from propagation delays, which problems often exist in conventional binary counters.

So long as the oscillator comprised of Miller integrator 10 and saturating switch means 16 produces triangular and square waveforms in quadrature phase, a succession of phases $\Phi_1$—$\Phi_4$ will occur in sequence. However, if the operational amplifier 18 is clamped to a constant output potential, whether positive or negative, by a nonzero gate at input 24, the triangular waveform will reach a maximum level of opposite polarity and will remain constant. This, results in a steady state reference phase from one of the amplifiers 40. The sequence of output phase resumes, however, when the input at switch 22 of operational amplifier 18 again becomes grounded.

Because the amplifier 18 is a differential amplifier, which compares the DC levels of the signals at the two inputs thereto, it is possible to move the switching threshold from ground reference and achieve a gating function. Since the inputs to amplifier 18 are both high impedance points, the on-off signal to the input associated with switch 22 is readily supplied by an output from any logic element and the amplifier 18 performs as a comparator/switch to generate the square waveform.

The configuration of the oscillator of this invention lends itself particularly well to the use of integrated circuits and only resistance and capacitance elements need to be used externally to the integrated circuits in the oscillator. The component values of the resistances 52 and 53 are the same order of magnitude with the resistance ratio closely approaching unity. However, the ratio of resistance 52 with respect to resistance 53 must be less than one to permit the triangular peak to occur at something less than saturation level for the integrator output.

As illustrated and described the output phases $\Phi_1$—$\Phi_4$ are of approximately equal duration because the switching point of the comparator circuits 26 and 28 is near zero voltage. However, if comparator 26 were to switch at some positive or negative level greater than zero but less than peak, the phases could be shortened or lengthened proportionally. This alteration could be helpful if outputs of alternately short and long duration were desired while preserving the same total period. Furthermore, by having the comparators 26 and 28, the output waveforms $\Phi_1$—$\Phi_4$ are not dependent upon input dv/dt (rate of change) which for the triangular waveform is small and for the square waveform is limited by amplifier slewing rate. The purpose is to avoid keeping gates 34 in a linear oscillation prone region while crossing the switching threshold.

The circuit of this invention is particularly well suited to free-running use since no special start or latching problem exists. Furthermore, the high gain operational amplifiers 12 and 18 contribute to stability and provide low impedance output without the need for extra isolation.

Thus, this invention provides for a simple and stable four-phase digital clock circuit that is particularly adapted for integrated circuits and which uses a minimum of external parts. It should be understood, of course, that the foregoing disclosure relates to only a preferred embodiment of the invention and that numerous modifications or alterations may be made therein without departing from the spirit and scope of the invention.

What I claim is:

1. A multiphase digital clock for use in digital systems, comprising:

first amplifier means for providing a substantially triangular waveshape output signal;

nonlinear or saturating switch means operatively associated with said first amplifier means for providing a substantially square waveshape output signal;

means coupling the output of said switch means to an input of said first amplifier means for providing positive feedback to said first amplifier means; and logic means coupled to the outputs of said first amplifier means and said switch means for providing a multiphase digital clock signal.

2. A multiphase digital clock as in claim 1 wherein said triangular waveshape output signal and said square waveshape output signal are in quadrature with respect to one another.

3. A multiphase digital clock as in claim 2 wherein said logic means includes:

first comparator means coupled to the output of said first amplifier means for producing a first predetermined output signal in relationship with a predetermined characteristic of said triangular waveshape output signal;

second comparator means coupled to the output of said saturating switch means for producing a second predetermined output signal in relationship with a predetermined characteristic of said square waveshape output signal; and output means electrically coupled to said first and second comparator means for providing multiphase digital clock signals.

4. A digital clock as in claim 3 for providing a four-phase digital clock output wherein said saturating switch means includes a high gain positive feedback amplifier.

5. A digital clock as in claim 4 wherein said first amplifier means includes a Miller integrator having an operational amplifier and a feedback capacitor connected between the output and input of said operational amplifier.

6. A digital clock as in claim 5 wherein said output means include:

gate means for gating out said clock signals;

first inverter means coupled between said first capacitor means and said gate means for inverting the signal output from said first comparator means;

second inverter means coupled between said second comparator means and said gate means for inverting the signal output from said second comparator means; and third inverter means respectively coupled to the outputs from said gate means for providing said four-phase digital clock output.

7. A digital clock as in claim 6 wherein said first and second comparator means each include a Schmitt trigger circuit.

8. A digital clock as in claim 7 further including:

means for selectively applying a gate signal to said saturating switch means.

9. A multiphase digital clock comprising:

oscillator means for simultaneously providing a first substantially triangular waveshape output signal and a second substantially square waveshape output signal in quadrature with respect to one another; and logic means coupled to the outputs of said oscillator means for providing a multiphase digital clock signal.